US008705780B2

(12) United States Patent
Yoon et al.

(10) Patent No.: US 8,705,780 B2
(45) Date of Patent: *Apr. 22, 2014

(54) AUDIO APPARATUS, AUDIO SIGNAL TRANSMISSION METHOD, AND AUDIO SYSTEM

(71) Applicant: Samsung Electronics Co., Ltd., Suwon-si (KR)

(72) Inventors: Eung-sik Yoon, Suwon-si (KR); Yong-jin Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/895,105

(22) Filed: May 15, 2013

(65) Prior Publication Data

US 2013/0251178 A1 Sep. 26, 2013

Related U.S. Application Data

(63) Continuation-in-part of application No. 12/902,367, filed on Oct. 12, 2010, now Pat. No. 8,457,334.

(30) Foreign Application Priority Data

Dec. 23, 2009 (KR) ........................ 10-2009-0129674

(51) Int. Cl.
*H04R 5/02* (2006.01)
*H04R 5/00* (2006.01)
*H03G 3/00* (2006.01)

(52) U.S. Cl.
USPC ............. 381/311; 381/306; 381/300; 381/80; 381/105; 381/79

(58) Field of Classification Search
USPC ........... 381/311, 306, 307, 300, 2, 80, 105, 6, 381/16, 14, 77, 79, 18
See application file for complete search history.

(56) References Cited

U.S. PATENT DOCUMENTS 4,621,374 A 11/1986 Micic et al.
5,491,839 A 2/1996 Schotz
5,666,422 A 9/1997 Harrison et al.

(Continued)

FOREIGN PATENT DOCUMENTS

KR 10-2009-0099669 A 9/2009
WO 2005/124764 A1 12/2005

OTHER PUBLICATIONS

Extended European Search Report issued on May 25, 2011 in the corresponding European Patent Application No. 10195275.2.

(Continued)

*Primary Examiner* — Edgardo San Martin
(74) *Attorney, Agent, or Firm* — Sughrue Mion, PLLC

(57) ABSTRACT

An audio apparatus, an audio signal transmission method, and an audio system are provided. The audio signal transmission method includes: wirelessly receiving an audio signal from a first external device; converting the received audio signal into audio signals of multi-channels; and wirelessly transmitting an audio signal of at least one of the multi-channels to at least one of second external devices. Therefore, the audio apparatus wirelessly communicates with a plurality of external devices, and thus a user can connect an audio device to an external device without using wired cables.

16 Claims, 7 Drawing Sheets

(56) References Cited

U.S. PATENT DOCUMENTS

| | | | | |
|---|---|---|---|---|
| 5,832,024 | A | 11/1998 | Schotz et al. | |
| 6,466,832 | B1 | 10/2002 | Zuqert et al. | |
| 6,487,296 | B1 | 11/2002 | Allen et al. | |
| 6,590,982 | B1 | 7/2003 | Chen | |
| 6,608,907 | B1 | 8/2003 | Lee | |
| 6,684,060 | B1 | 1/2004 | Curtin | |
| 6,741,708 | B1 | 5/2004 | Nakatsugawa | |
| 6,778,869 | B2 | 8/2004 | Champion | |
| 6,959,991 | B2 | 11/2005 | Ho et al. | |
| 7,024,003 | B2 | 4/2006 | Dupeire | |
| 7,252,383 | B2 | 8/2007 | Ho et al. | |
| 7,483,538 | B2 | 1/2009 | McCarty et al. | |
| 7,539,889 | B2 | 5/2009 | Celinski et al. | |
| 7,653,344 | B1 | 1/2010 | Feldman et al. | |
| 7,987,294 | B2 | 7/2011 | Bryce et al. | |
| 8,050,203 | B2 | 11/2011 | Jacobsen et al. | |
| 8,165,315 | B2 | 4/2012 | Tornatta et al. | |
| 8,340,330 | B2 * | 12/2012 | Yoon et al. | 381/307 |
| 8,457,334 | B2 * | 6/2013 | Yoon et al. | 381/311 |
| 2003/0235314 | A1 | 12/2003 | Wang | |
| 2004/0037433 | A1 | 2/2004 | Chen | |
| 2004/0039462 | A1 | 2/2004 | Chen | |
| 2004/0041989 | A1 | 3/2004 | Olson et al. | |
| 2004/0234088 | A1 | 11/2004 | McCarty et al. | |
| 2005/0136839 | A1 | 6/2005 | Seshadri et al. | |
| 2006/0009985 | A1 | 1/2006 | Ko et al. | |
| 2007/0087686 | A1 | 4/2007 | Holm et al. | |
| 2008/0008338 | A1 | 1/2008 | Yoon et al. | |
| 2008/0092204 | A1 | 4/2008 | Bryce et al. | |
| 2008/0205658 | A1 | 8/2008 | Breebaart | |
| 2009/0081948 | A1 | 3/2009 | Banks et al. | |
| 2009/0245548 | A1 | 10/2009 | Yoon et al. | |
| 2009/0320024 | A1 * | 12/2009 | Eom et al. | 718/100 |
| 2010/0142735 | A1 * | 6/2010 | Yoon et al. | 381/303 |
| 2011/0149768 | A1 | 6/2011 | Kang et al. | |

OTHER PUBLICATIONS

Communication, dated Sep. 28, 2012, issued by the European Patent Office in counterpart Eropean Patent Application No. 12171407.5.

* cited by examiner

AUDIO APPARATUS, AUDIO SIGNAL TRANSMISSION METHOD, AND AUDIO SYSTEM

CROSS-REFERENCE TO RELATED APPLICATION

This Application is a Continuation of patent application Ser. No. 12/902,367, filed Oct. 12, 2010, which claims priority from Korean Patent Application No. 10-2009-0129674, filed on Dec. 23, 2009 in the Korean Intellectual Property Office, the disclosures of which are incorporated herein by reference in their entirety.

BACKGROUND

1. Field

Apparatuses and methods consistent with the exemplary embodiments relate to an audio apparatus, an audio signal transmission method thereof, and an audio system, and more particularly, to an audio apparatus which transmits an audio signal received from an external device to a speaker, an audio signal transmission method thereof, and an audio system.

2. Description of the Related Art

With the rapid development of multimedia technology, it has been possible for a user to watch a high-definition video and to listen to sound having a loud and rich audio source using various multimedia tools such as a high-definition television (HDTV) or a digital versatile disc (DVD).

Display apparatuses have become thinner to reflect the demand of a user who desires to mount a display apparatus on a wall. Therefore, an external speaker which requires a large volume is provided separately from a display apparatus to be slimmed.

A display apparatus and an audio apparatus are separately provided, and thus the apparatuses require a connection therebetween for data transmission. In a related art, a display apparatus and an audio apparatus are connected to each other through a cable for data transmission. In addition, if the related art audio apparatus supports a 5.1-channel output, the related art audio apparatus transmits data to a separate speaker using a cable.

Cables connecting a display apparatus and an audio apparatus or an audio apparatus and a speaker clutter a space where a user listens to sound. Therefore, it is inconvenient to connect and mount related art apparatuses, and cables connecting the apparatuses spoil the appearance.

SUMMARY

Exemplary embodiments address at least the above problems and/or disadvantages and other disadvantages not described above. Also, an exemplary embodiment is not required to overcome the disadvantages described above, and an exemplary embodiment may not overcome any of the problems described above.

Exemplary embodiments provide an audio apparatus to process an audio signal wirelessly received from an external device and then to wirelessly transmit the processed signal to another external device, an audio signal transmission method thereof, and an audio system.

According to an aspect of an exemplary embodiment, there is provided an audio signal transmission method, including: wirelessly receiving an audio signal from a first external device; converting the received audio signal into audio signals of multi-channels; and wirelessly transmitting a first audio signal of the audio signals of the multi-channels to a second external device.

The audio signal transmission method may further include outputting a second audio signal of the audio signals of the multi-channels.

The audio signal wirelessly received from the first external device may include an audio signal of a stereo channel, and the converting may convert the audio signal received from the first external device from the stereo channel audio signal into a 5.1-channel audio signal.

The second audio signal may be of at least one of a center channel and a front channel.

The second external device may include a speaker which outputs at least one of rear channel audio signals and a sub-woofer channel audio signal.

A radio communication between an audio apparatus and the first external device and a radio communication between an audio apparatus and the at least one second external device may use time division multiplexing.

The first external device may include at least one of a television (TV), a computer, and an MPEG layer 3 (MP3) player.

According to an aspect of another exemplary embodiment, there is provided an audio apparatus including: a transmission and reception unit which wirelessly receives an audio signal from a first external device; an audio signal processor which converts the received audio signal into audio signals of multi-channels; and a controller which controls the transmission and reception unit to wirelessly transmit a first audio signal of the audio signals of the multi-channels to a second external device.

The audio apparatus may further include an audio output unit which outputs a second audio signal of the audio signals of the multi-channels.

The audio signal wirelessly received from the first external device may include an audio signal of a stereo channel, and the audio signal processor may convert the audio signal received from the first external device from the stereo channel audio signal into a 5.1-channel audio signal.

The second audio signal may include at least one of a center channel and a front channel.

The second external device may include a speaker which outputs at least one of rear channel audio signals and a sub-woofer channel audio signal.

A radio communication between the audio apparatus and the first external device and a radio communication between the audio apparatus and the at least one second external device may use time division multiplexing which synchronizes time when a radio signal is output.

The external device may include one of a television (TV), a computer, and an MPEG layer 3 (MP3) player.

According to an aspect of another exemplary embodiment, there is provided an audio system, including: a display apparatus; and a master speaker device which wirelessly receives an audio signal from the display apparatus, processes the received audio signal, and wirelessly transmits the audio signal to a plurality of slave speaker devices.

The display apparatus may be a wall-mounted display device.

The display apparatus may transmit the audio signal to the master speaker device using a dongle for a radio communication.

The master speaker device may convert the received audio signal into audio signals of multi-channels, and transmit the converted audio signals to the plurality of slave speaker devices corresponding to the multi-channel.

The master speaker device may be a wall-mounted sound bar.

According to an aspect of another exemplary embodiment, there is provided a display apparatus including: an audio processor which processes audio data into an audio signal; and a radio communication unit which wirelessly transmits the audio signal to an audio apparatus to be converted by the audio apparatus into audio signals of multi-channels.

BRIEF DESCRIPTION OF THE DRAWINGS

The above and/or other aspects will be more apparent by describing certain exemplary embodiments with reference to the accompanying drawings, in which.

DETAILED DESCRIPTION OF EXEMPLARY EMBODIMENTS

Figure 1:
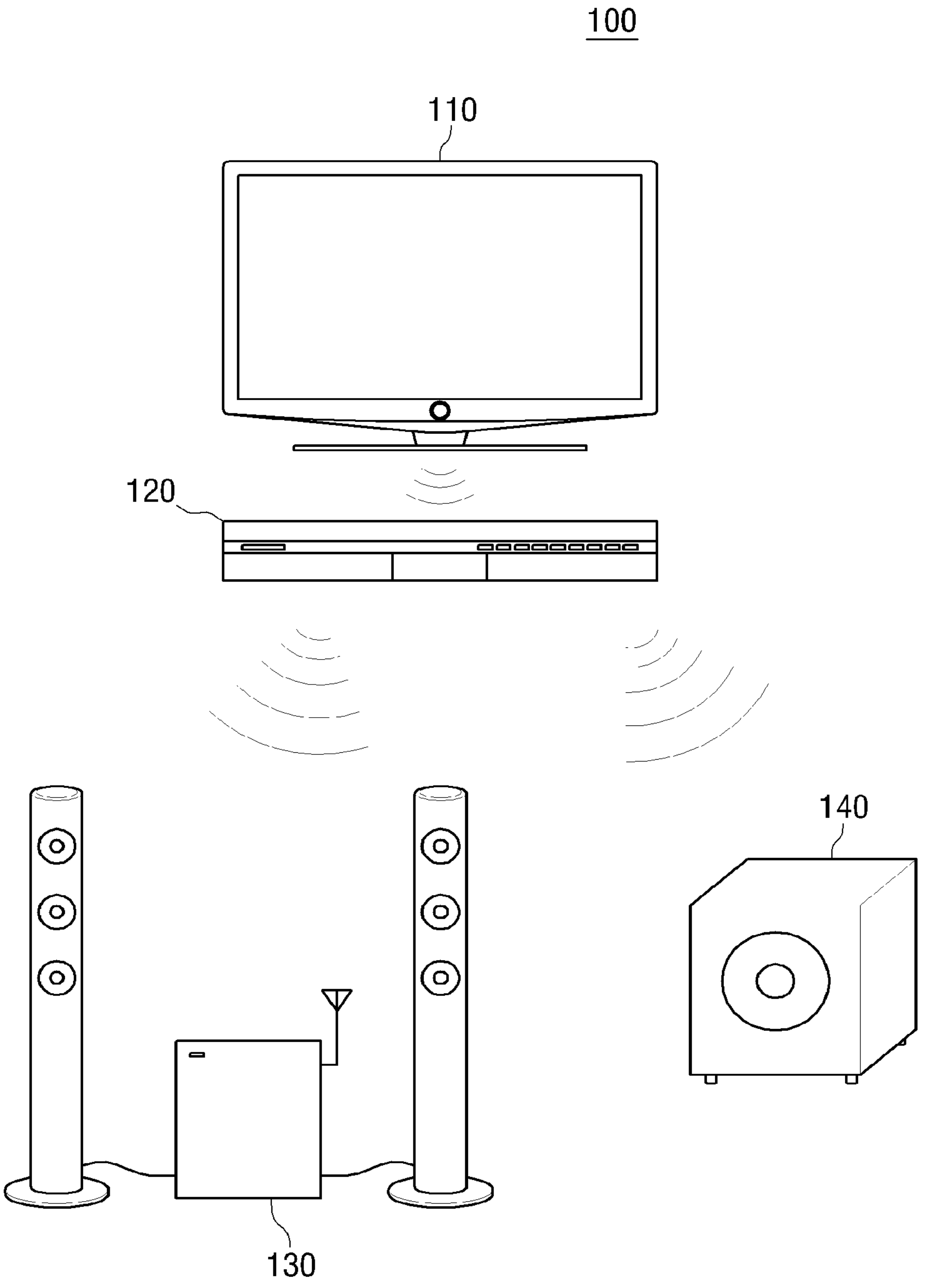
FIG. 1 is a view illustrating an audio system for wirelessly transmitting and receiving an audio signal according to an exemplary embodiment.

Certain exemplary embodiments will now be described in greater detail with reference to the accompanying drawings. In the following description, the same drawing reference numerals are used for the same elements even in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, well-known functions or constructions are not described in detail since they would obscure the invention with unnecessary detail. Expressions such as "at least one of," when preceding a list of elements, modify the entire list of elements and do not modify the individual elements of the list.

FIG. 1 is a view illustrating an audio system 100 for wirelessly transmitting and receiving an audio signal according to an exemplary embodiment. The audio system 100 provides a user with a 5.1-channel audio signal. A 5.1-channel sound system may include a system body which supports a digital theater system (DTS) and a Dolby system, and 5.1-channel speakers which include a left-front speaker, a center speaker, a right-front speaker, a left-rear speaker, a right-rear speaker, and a subwoofer. It is understood that other exemplary embodiments are not limited to the audio system 100 providing a user with a 5.1 channel audio signal. For example, in another exemplary embodiment, the audio system 100 provides a user with a 1 channel audio signal (i.e., mono signal), a 2 channel audio signal, a 7.1 channel audio signal, a 7.2 channel audio signal, a split audio signal (e.g., 5.1 channel for a first domain and 2 channel for a second domain), etc.

As shown in FIG. 1, the audio system 100 includes a TV 110, a sound bar 120 which is an audio apparatus, a rear speaker unit 130, and a subwoofer speaker unit 140. The sound bar 120 is an audio apparatus which is separated from a display apparatus, and operates to process an audio signal of the display apparatus and to output audio. According to the present exemplary embodiment, the center speaker and the front speakers (not shown) are mounted in the sound bar 120.

Hereinbelow, overall operations of the audio system 100 will be explained, and the TV 110, the sound bar 120, the rear speaker unit 130, and the subwoofer speaker unit 140 will be explained later in detail with reference to FIGS. 2 and 5.

The TV 110 receives a broadcast signal from a broadcast station or a satellite over wire or wirelessly, or receives a video signal from a device connected thereto. The TV 110 processes the received broadcast signal or video signal, and extracts an audio signal from the received signal. The TV 110 wirelessly transmits the extracted audio signal to the sound bar 120. The transmitted audio signal may be a stereo channel audio signal.

The sound bar 120 operates as a master speaker which processes an audio signal transmitted from the TV 110, and then outputs and distributes the transmitted audio signal. That is, the sound bar 120 processes the audio signal transmitted from the TV 110 to be a multi channel audio signal, transmits some of the processed audio signal to a slave speaker device (for example, rear speakers and a subwoofer speaker), and outputs the other audio signals.

For example, if the sound bar 120 receives a stereo channel audio signal, the sound bar 120 converts the stereo channel audio signal into a 5.1-channel audio signal, and then processes the converted 5.1-channel audio signal. The sound bar 120 separates the converted 5.1-channel audio signal into audio signals for each channel.

The sound bar 120 wirelessly transmits rear channel audio signals of the separated audio signals to the rear speaker unit 130. The rear speaker unit 130 separates the wirelessly received rear channel audio signals into a right-rear channel audio signal and a left-rear channel audio signal. However, it is understood that all exemplary embodiments are not limited thereto, and the rear speaker unit 130 may separately receive the right-rear channel audio signal and a left-rear channel audio signal according to another exemplary embodiment. The rear speaker unit 130 amplifies the separated right-rear channel audio signal and left-rear channel audio signal, and transmits the amplified signals to the left-rear speaker and the right-rear speaker, respectively. Therefore, the right-rear channel audio signal is output to the right-rear speaker, and the left-rear channel audio signal is output to the left-rear speaker.

The sound bar 120 wirelessly transmits the subwoofer channel audio signal of the separated audio signals to the subwoofer speaker unit 140. The subwoofer speaker unit 140 outputs the wirelessly received subwoofer channel audio signal.

The sound bar 120 outputs the right-front channel audio signal, the left-front channel audio signal, and the center channel audio signal itself among the separated audio signals. That is, the right-front channel audio signal is output to the right-front speaker which is mounted in the sound bar 120, the left-front channel audio signal is output to the left-front speaker which is mounted in the sound bar 120, and the center channel audio signal is also output to the center speaker which is mounted in the sound bar 120.

The sound bar 120 wirelessly receives an audio signal from the TV 110, and wirelessly transmits the audio signals to the rear speaker unit 130, and the subwoofer speaker unit 140 through a single radio transceiver unit. In this situation, as the sound bar 120 wirelessly communicates with a plurality of external devices, radio frequency interference may occur, thereby preventing a user from listening to audio of desired quality.

According to an exemplary embodiment, the sound bar 120 transmits a plurality of audio signals using time division multiplexing so that radio frequency interference is minimized. The time division multiplexing will be explained with reference to FIG. 6.

Figure 6:
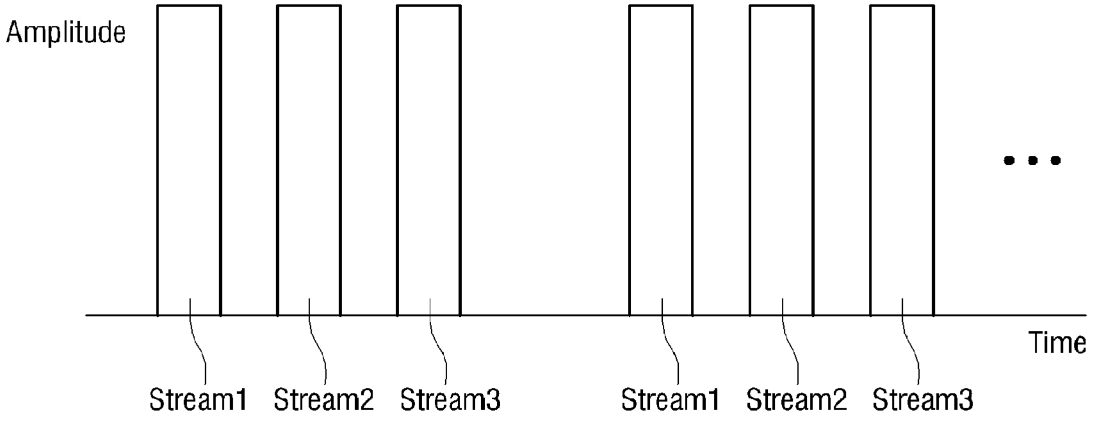
FIG. 6 is a view provided to explain time division multiplexing for a radio communication according to an exemplary embodiment.

FIG. 6 is a graph provided to explain an audio signal transmission method using time division multiplexing according to an exemplary embodiment. In the time division multiplexing, the time domain is divided into several timeslots, and the time slots are sequentially distributed to a plurality of radio channels.

In the present disclosure, the TV 110 and the sound bar 120 use a radio channel which is referred to as Stream 1, the sound bar 120 and the rear speaker unit 130 use a radio channel which is referred to as Stream 2, and the sound bar 120 and the subwoofer speaker unit 140 use a radio channel which is referred to as Stream 3.

The data transmission time is divided into predetermined time slots as shown in FIG. 6. Stream 1 is transmitted first, Stream 2 is transmitted subsequent to Stream 1, and then Stream 3 is transmitted and the process repeats itself (i.e., Stream 1 is transmitted again, and so on). That is, Stream 1, Stream 2, and Stream 3 are repeatedly transmitted in that order by predetermined time slots. Therefore, even if the sound bar 120 transmits and receives data through a plurality of radio channels, the radio channels are not overlapped. Accordingly, the sound bar 120 may eliminate the radio frequency interference.

As described above, the sound bar 120 wirelessly transceives an audio signal to and from the TV 110, the rear speaker unit 130, and the subwoofer speaker unit 140. Therefore, a user may convert a stereo channel audio output of the TV 110 into a 5.1-channel audio output, and listen to the audio using the sound bar 120 without using an additional wired cable.

Figure 2:
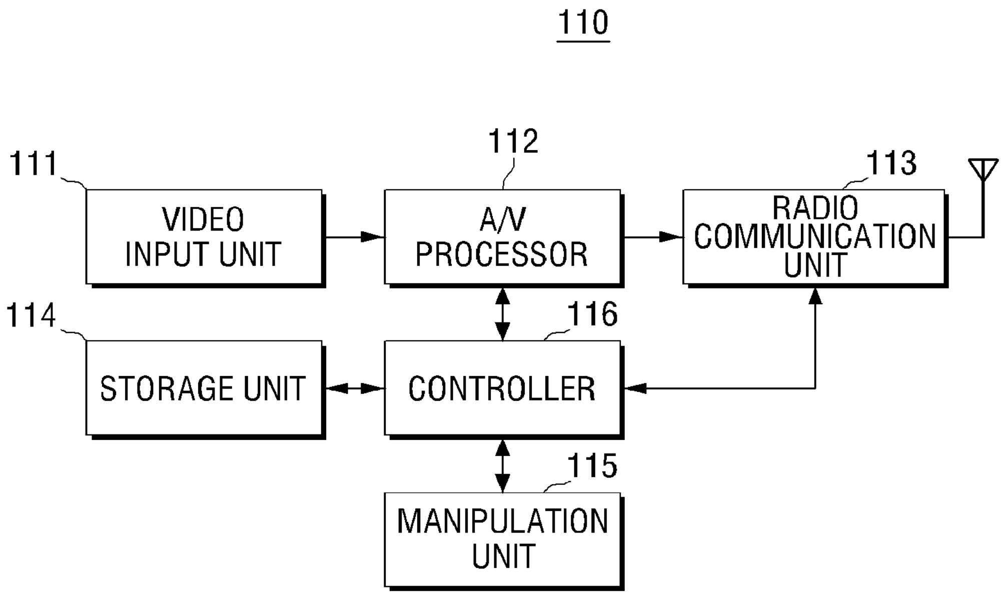
FIG. 2 is a block diagram illustrating a television (TV) of an audio system according to an exemplary embodiment.

FIG. 2 is a block diagram illustrating the TV 110 of the audio system 100 according to an exemplary embodiment. Referring to FIG. 2, the TV 110 includes a video input unit 111, an audio/video (A/V) processor 112, a radio communication unit 113, a storage unit 114, a manipulation unit 115, and a controller 116.

The video input unit 111 is connected to an external device (for example, a DVD player), and receives a video signal.

The A/V processor 112 separates data input through the video input unit 111 into audio data and video data. A video processor performs signal processing such as video decoding and video scaling on the video data. An audio processor processes the audio data to be transmitted to the sound bar 120, and transmits the processed audio data to the radio communication unit 113. As an example, the audio signal may be an audio signal of a stereo channel type.

The radio communication unit 113 selects a modulation scheme according to a control signal of the controller 116, and transmits the signal-processed audio signal to the sound bar 120. The radio communication unit 113 may be mounted in the TV 110, or may be a dongle (e.g., a universal serial bus dongle) for radio communication with the sound bar.

The storage unit 114 stores a video received from the video input unit 111. The storage unit 114 may be implemented as a volatile memory (such as RAM, etc.) or a non-volatile memory (such as a hard disc drive, flash memory, ROM, etc.).

The manipulation unit 115 receives an input from a user, and transmits the input to the controller 116. The manipulation unit 115 may be implemented using at least one of a remote controller, a pointing device, a touch pad, a touch screen, etc.

The controller 116 controls overall operations of the TV 110. To be more specific, the controller 116 recognizes a user's command based on the input transmitted from the manipulation unit 115, and controls overall operations of the TV 110 according to the user's command. The controller 116 controls the A/V processor 112 to separately process the video data and audio data input through the video input unit 111. To transmit the processed audio signal to the sound bar 120, the controller 116 generates a control signal to select a modulation scheme, and transmits the generated control signal to the radio communication unit 113.

Figure 3:
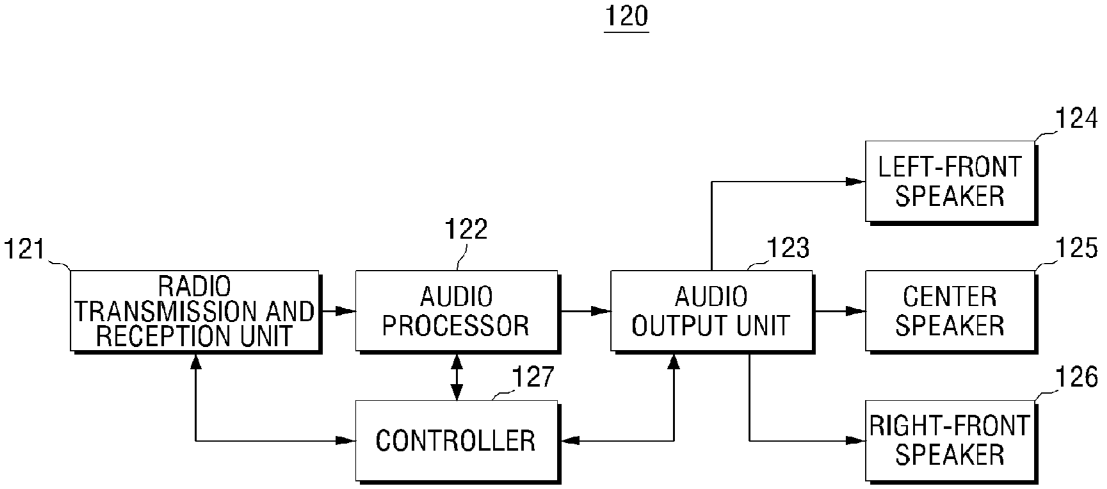
FIG. 3 is a block diagram illustrating a sound bar of an audio system according to an exemplary embodiment.

FIG. 3 is a block diagram illustrating the sound bar 120 of the audio system 100 according to an exemplary embodiment. Referring to FIG. 3, the sound bar 120 includes a radio transmission and reception unit 121, an audio processor 122, an audio output unit 123, a left-front speaker 124, a center speaker 125, a right-front speaker 126, and a controller 127.

The radio transmission and reception unit 121 wirelessly receives a stereo channel audio signal from the TV 110. The radio transmission and reception unit 121 transmits the received stereo channel audio signal to the audio processor 122.

The radio transmission and reception unit 121 wirelessly transmits to the rear speaker unit 130 a rear channel audio signal which is processed by the audio processor 122 to be separated. Furthermore, the radio transmission and reception unit 121 wirelessly transmits an audio signal of a subwoofer channel to the subwoofer speaker unit 140. Alternatively, the radio transmission and reception unit 121 may be implemented to transmit a right-rear channel audio signal and a left-rear channel audio signal to the rear speaker unit 130, and to transmit a subwoofer channel audio signal to the subwoofer speaker unit 140.

When the sound bar 120 wirelessly communicates with the plurality of external devices 110, 130, 140, the radio transmission and reception unit 121 wirelessly transmits and receives an audio signal using time division multiplexing.

The audio processor 122 decodes a stereo channel audio signal which is received through the radio transmission and reception unit 121. The audio processor 122 converts the decoded stereo channel audio signal into, for example, a 5.1-channel audio signal, and then processes the converted signal.

The audio processor 122 separates the decoded 5.1-channel audio signal into an audio signal which will be output to the speaker mounted in the sound bar 120 and an audio signal which will be wirelessly transmitted. Among the separated audio signals, the audio processor 122 transmits a 3-channel audio signal to be output through the speaker mounted in the sound bar 120 to the audio output unit 123. Herein, the 3-channel audio signal uses a right-front channel, a left-front channel, and a center channel. The audio processor 122 transmits a 2.1-channel audio signal to be wirelessly transmitted to the external speaker to the radio transmission and reception unit 121. Herein, the 2.1-channel audio signal uses a right-rear channel, a left-rear channel, and a subwoofer channel.

The audio output unit 123 receives the 3-channel audio signal from the audio processor 122. The audio output unit 123 converts the received audio signal into a format in which an audio signal is capable of being output through a speaker.

Specifically, the audio output unit 123 converts the 3-channel audio signal separated by the audio processor 122 into a pulse width modulation (PWM) signal using a pulse width modulation integrated circuit (PWM IC) mounted therein, and switches the converted PWM signal to extract a left-front channel audio signal, a center channel audio signal, and a right-front channel audio signal.

The audio output unit 123 transfers the extracted audio signal to each of the speakers mounted in the sound bar 120. In more detail, the audio output unit 123 transfers the left-front channel audio signal to the left-front speaker 124, the center channel audio signal to the center speaker 125, and the right-front channel audio signal to the right-front speaker 126.

The radio transmission and reception unit 121 wirelessly transmits the received 2.1-channel audio signal to the rear speaker unit 130 and the subwoofer speaker unit 140.

The controller 127 controls overall operations of the sound bar 120. Specifically, the controller 127 controls the radio transmission and reception unit 121, the audio processor 122, and the audio output unit 123 to provide a user with a 5.1-channel audio signal. Furthermore, the controller 127 controls the audio processor 122 to convert the stereo channel audio signal transmitted to the radio transmission and reception unit 121 into a 5.1-channel audio signal. Also, the controller 127 controls the audio processor 122 to extract an audio signal of a subwoofer channel and an audio signal of a 2.1-channel of a rear channel from the 5.1-channel audio signal.

The controller 127 controls the audio output unit 123 to transmit the subwoofer channel audio signal and the rear channel audio signal separated by the audio processor 122 to the radio transmission and reception unit 121. Moreover, the controller 127 controls the audio output unit 123 to transmit the left-front channel audio signal, the center channel audio signal, and the right-front channel audio signal to the left-front speaker 124, the center speaker 125, and the right-front speaker 126, respectively.

Figure 4:
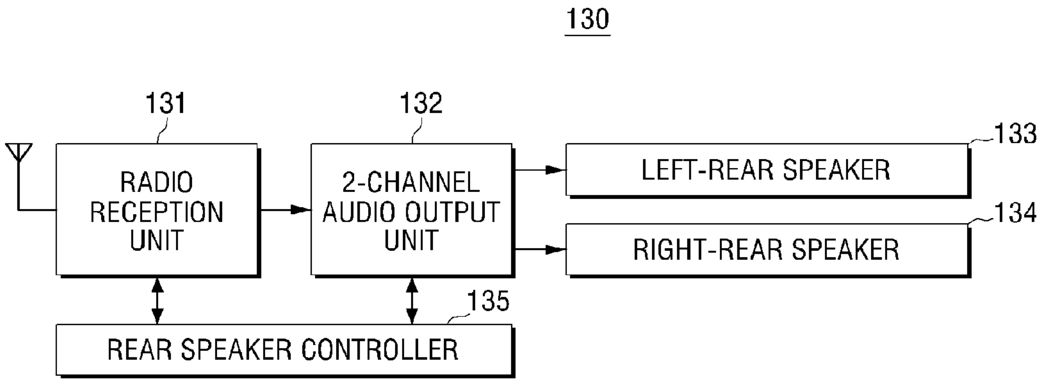
FIG. 4 is a block diagram illustrating a rear speaker of an audio system according to an exemplary embodiment.

FIG. 4 is a block diagram illustrating the rear speaker unit 130 of the audio system 100 according to an exemplary embodiment. Referring to FIG. 4, the rear speaker unit 130 includes a radio reception unit 131, a 2-channel audio output unit 132, a left-rear speaker 133, a right-rear speaker 134, and a rear speaker controller 135.

The radio reception unit 131 wirelessly receives an audio signal from the radio transmission and reception unit 121 of the sound bar 120. The audio signal wirelessly transmitted from the radio transmission and reception unit 121 is a rear channel audio signal. The audio signal wirelessly transmitted from the radio transmission and reception unit 121 may include only a rear channel audio signal, or may also include both a subwoofer channel audio signal and a rear channel audio signal. In the instant exemplary embodiment, the audio signal includes only a rear channel audio signal for convenience of description.

The radio reception unit 131 transfers a wirelessly received audio signal to the 2-channel audio output unit 132.

The 2-channel audio output unit 132 receives the audio signal from the radio reception unit 131, separates the received audio signal into a left-rear channel audio signal and a right-rear channel audio signal, and processes the separated audio signals.

The 2-channel audio output unit 132 amplifies the separated left-rear channel audio signal and right-rear channel audio signal, and transfers the amplified audio signals to the left-rear speaker 133 and the right-rear speaker 134, respectively.

The left-rear speaker 133 outputs a left-rear channel audio signal. The right-rear speaker 134 outputs a right-rear channel audio signal.

The rear speaker controller 135 controls overall operations of the rear speaker unit 130. Specifically, the rear speaker controller 135 controls the 2-channel audio output unit 132 to amplify the received audio signal. Furthermore, the rear speaker controller 135 controls the 2-channel audio output unit 132 to separate the rear channel audio signals into a left-rear channel audio signal and a right-rear channel audio signal.

Figure 5:
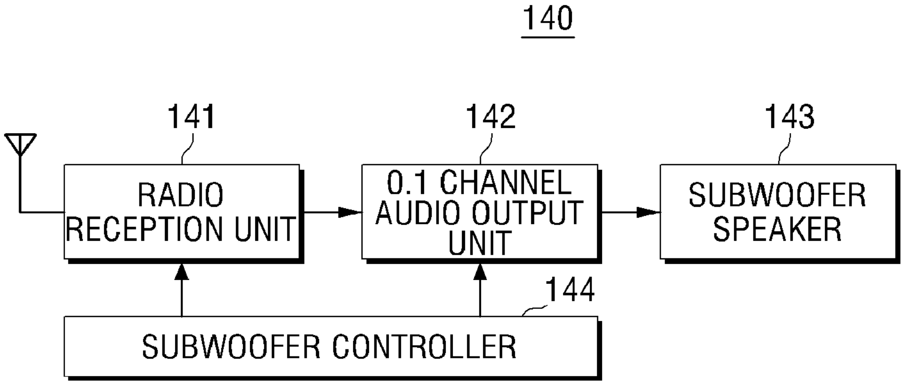
FIG. 5 is a block diagram illustrating a subwoofer speaker of an audio system according to an exemplary embodiment.

FIG. 5 is a block diagram illustrating the subwoofer speaker unit 140 of the audio system 100 according to an exemplary embodiment. In the instant exemplary embodiment, the subwoofer speaker unit 140 is provided to play back audio, in which a separate channel is used for low sound.

Referring to FIG. 5, the subwoofer speaker unit 140 includes a radio reception unit 141, a 0.1 channel audio output unit 142, a subwoofer speaker 143, and a subwoofer controller 144.

The radio reception unit 141 wirelessly receives an audio signal from the radio transmission and reception unit 121 of the sound bar 120. Herein, the audio signal wirelessly transmitted by the radio transmission and reception unit 121 of the sound bar 120 may be an audio signal of a subwoofer channel.

The radio reception unit 141 transfers the wirelessly received audio signal to the 0.1 channel audio output unit 142.

The 0.1 channel audio output unit 142 amplifies the received subwoofer channel audio signal, and transmits the amplified audio signal to the subwoofer speaker 143. Then, the subwoofer speaker 143 outputs the subwoofer audio signal of 0.1 channel where low sound has been collected separately.

The subwoofer controller 144 controls overall operations of the subwoofer speaker unit 140. To be more specific, the subwoofer controller 144 controls the radio reception unit 141 to have an identification (ID) matching with an ID of the radio transmission and reception unit 121 of the sound bar 120. Furthermore, the subwoofer controller 144 controls the 0.1-channel audio output unit 142 to amplify and output the received audio signal.

Figure 7:
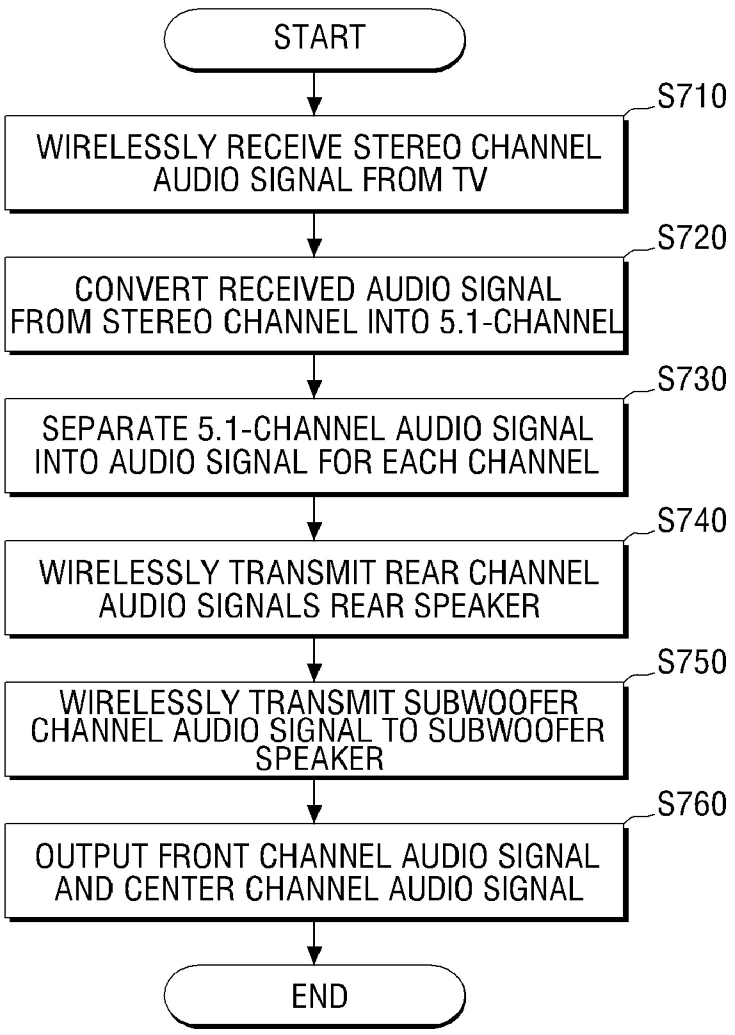
FIG. 7 is a flowchart provided to explain a method of a sound bar wirelessly transmitting and receiving an audio signal according to an exemplary embodiment.

FIG. 7 is a flowchart provided to explain a method of a sound bar 120 wirelessly transmitting and receiving an audio signal according to an exemplary embodiment. Referring to FIG. 7, the sound bar 120 wirelessly receives a stereo channel audio signal from the TV 110 (S710).

If the sound bar 120 wirelessly receives an audio signal from the TV 110, the sound bar 120 processes the received audio signal to be converted into an audio signal of a 5.1-channel (S720).

The sound bar 120 separates the converted 5.1-channel audio signal into an audio signal for each channel (S730). This is for the sound bar 120 to output a part of the converted 5.1-channel audio signal itself, and to wirelessly transmit the other part to an external wireless speaker. Therefore, the sound bar 120 separates the 5.1-channel audio signal into the right-front channel audio signal, the left-front channel audio signal, and the center channel audio signal to be output by the sound bar 120, and the subwoofer channel audio signal and the rear channel audio signals to be wirelessly transmitted to an external speaker.

The sound bar 120 wirelessly transmits the rear channel audio signals from among the separated audio signals to the rear speaker unit 130 (S740). Herein, the rear channel audio signals transmitted to the rear speaker unit 130 are separated into the right-rear channel audio signal and the left-rear channel audio signal, and then amplified. The amplified audio signals are output to the left-rear speaker and the right-rear speaker, respectively.

The sound bar 120 wirelessly transmits the subwoofer channel audio signal among the separated audio signals to the subwoofer speaker unit 140 (S750). The subwoofer channel audio signal wirelessly transmitted to the subwoofer speaker unit 140 is output to the subwoofer speaker 143.

Among the separated audio signals, the sound bar 120 outputs the right-front channel audio signal, the left-front channel audio signal, and the center channel audio signal itself (S760). That is, the right-front channel audio signal is output to the right-front speaker mounted in the sound bar 120, the left-front channel audio signal is output to the left-front channel speaker mounted in the sound bar 120, and the center channel audio signal is output to the center speaker mounted in the sound bar 120.

If the audio signals are wirelessly transmitted and received through the above operations, a user may listen to 5.1-channel audio through the sound bar 120 without using an additional cable instead of the stereo channel audio of the TV 110.

While the TV 110 is provided as the external device in the above-described exemplary embodiments, it is understood that the TV 110 is merely exemplary for convenience of description. That is, it is understood that aspects of the exemplary embodiments may be applied to any device which wirelessly provides an audio signal. For instance, the first external device may be embodied using a wall-mounted display device, a computer, and an MPEG layer 3 (MP3) player.

Furthermore, while the sound bar 120 is provided as an audio device in the above-described exemplary embodiments, it is understood that the sound bar 120 is merely exemplary for convenience of description. That is, aspects of the exemplary embodiments may be applied to any device which wirelessly provides a multi channel audio signal. For instance, the audio device may be a home theater or a wall-mounted sound bar.

Also, while the above-described audio device is used to provide a 5.1-channel audio signal, it is understood that this is merely exemplary. That is, aspects of the exemplary embodiments may be applied to any audio device which provides a multi-channel audio signal, such as a 6.1 channel or a 7.1 channel audio system.

Moreover, while in the above-described exemplary embodiments, an audio signal of a 2.1 channel having a subwoofer channel and rear channels is wirelessly transmitted, it is understood that this is merely exemplary for convenience of description. That is, another exemplary embodiment may be implemented to wirelessly transmit an audio signal of at least one of rear channels, front channels, and a subwoofer channel.

As described above, according to exemplary embodiments, an audio device wirelessly communicates with a plurality of external devices, and thus a user may connect the audio device to the plurality of external devices without using cables.

While not restricted thereto, the exemplary embodiments can also be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, the exemplary embodiments may be written as computer programs transmitted over a computer-readable transmission medium, such as a carrier wave, and received and implemented in general-use digital computers that execute the programs. Moreover, while not required in all aspects, one or more units of the audio system 100 can include a processor or microprocessor executing a computer program stored in a computer-readable medium.

The foregoing exemplary embodiments and advantages are merely exemplary and are not to be construed as limiting the present invention. The present teaching can be readily applied to other types of apparatuses. Also, the description of exemplary embodiments is intended to be illustrative, and not to limit the scope of the claims, and many alternatives, modifications, and variations will be apparent to those skilled in the art.

What is claimed is:

1. An audio signal transmission method, comprising:

receiving an audio signal from a first external device;

converting a number of channels associated with the received audio signal to obtain audio signals of multi-channels; and transmitting a first audio signal, of the audio signals of the multi-channels, to a second external device, wherein the number of channels associated with the received audio signal is different from a number of channels associated with the audio signals of multi-channels.

2. The audio signal transmission method as claimed in claim 1, further comprising:

outputting, by a speaker, a second audio signal of the audio signals of the multi-channels, without externally transmitting the second audio signal.

3. The audio signal transmission method as claimed in claim 1, wherein:

the audio signal received from the first external device is a stereo channel audio signal; and the converting converts the received stereo channel audio signal into a 5.1-channel audio signal.

4. The audio signal transmission method as claimed in claim 2, wherein the second audio signal is of at least one of a center channel and a front channel.

5. The audio signal transmission method as claimed in claim 1, wherein the second external device comprises a speaker which outputs at least one of rear channel audio signals and a subwoofer channel audio signal comprised in the first audio signal.

6. The audio signal transmission method as claimed in claim 1, wherein:

the receiving the audio signal comprises receiving the audio signal in a radio communication between an audio apparatus and the first external device using time division multiplexing; and the transmitting the first audio signal comprises transmitting the first audio signal in a radio communication between the audio apparatus and the second external device using the time division multiplexing.

7. The audio signal transmission method as claimed in claim 1, wherein the first external device is at least one of a television (TV), a computer, and an MPEG layer 3 (MP3) player.

8. The audio signal transmission method as claimed in claim 1, further comprising:

transmitting a third audio signal, of the audio signals of the multi-channels, to a third external device.

9. The audio signal transmission method as claimed in claim 8, wherein the first audio signal is of at least one rear channel, and the third audio signal is of a subwoofer channel.

10. A non-transitory computer-readable recording medium having recorded thereon a program executable by a computer for performing an audio signal transmission method, the audio signal transmission method comprising:

receiving an audio signal from a first external device;

converting a number of channels associated with the received audio signal to obtain audio signals of multi-channels; and transmitting a first audio signal, of the audio signals of the multi-channels, to a second external device, wherein the number of channels associated with the received audio signal is different from a number of channels associated with the audio signals of multi-channels.

11. An audio apparatus comprising:

a transmission and reception unit which receives an audio signal from a first external device;

an audio signal processor which is operable to process the received audio signal by performing signal processing to convert a number of channels associated with the received audio signal in order to obtain audio signals of multi-channels; and a controller which controls the transmission and reception unit to transmit a first audio data, of the audio signal of the multi-channels, to a second external device, wherein the number of the channels associated with the received audio signal is different from a number of channels associated with the audio signals of multi-channels.

12. The audio apparatus as claimed in claim 11, further comprising:

an audio output unit which outputs, through a speaker, a second audio data of the processed audio data of multi-channels.

13. The audio apparatus as claimed in claim 11, wherein:

the audio signal received from the first external device is a stereo channel audio signal; and the audio signal processor converts the received stereo channel audio signal into a 5.1-channel audio signal.

14. The audio apparatus as claimed in claim 12, wherein the second audio data is of at least one of a center channel and a front channel.

15. The audio apparatus as claimed in claim 11, wherein the second external device comprises a speaker which outputs at least one of rear channel audio signals and a subwoofer channel audio signal comprised in the first audio data.

16. The audio apparatus as claimed in claim 12, wherein the external device is at least one of a television (TV), a computer, and an MPEG layer 3 (MP3) player.

* * * * *